US012519481B2

(12) United States Patent
Kozlov et al.

(10) Patent No.: US 12,519,481 B2
(45) Date of Patent: Jan. 6, 2026

(54) ANALOG TO DIGITAL CONVERTER FOR CONVERTING ANALOG SIGNAL TO DIGITAL SIGNAL

(71) Applicant: Renesas Design Technology Inc., Santa Clara, CA (US)

(72) Inventors: Vladyslav Kozlov, Lviv (UA); Dmytro Mymrikov, Santa Clara, CA (US)

(73) Assignee: Renesas Design Technology Inc., Santa Clara, CA (US)

( * ) Notice: Subject to any disclaimer, the term of this patent is extended or adjusted under 35 U.S.C. 154(b) by 277 days.

(21) Appl. No.: 18/336,526

(22) Filed: Jun. 16, 2023

(65) Prior Publication Data

US 2024/0421827 A1    Dec. 19, 2024

(51) Int. Cl.
*H03M 1/12*    (2006.01)
*H03M 1/38*    (2006.01)

(52) U.S. Cl.
CPC ........... *H03M 1/1245* (2013.01); *H03M 1/38* (2013.01)

(58) Field of Classification Search
CPC .............................. H03M 1/1245; H03M 1/38
USPC ........................................ 341/161, 155, 144
See application file for complete search history.

(56) References Cited

U.S. PATENT DOCUMENTS

| 5,481,748 | A * | 1/1996 | Cunto ............... | G06F 17/10 708/508 |
| 9,774,343 | B1 | 9/2017 | Liaghati | |
| 2010/0060503 | A1* | 3/2010 | Sakakibara ....... | H04N 25/65 341/161 |
| 2013/0198535 | A1* | 8/2013 | Takashima ........ | G06F 1/266 713/300 |

OTHER PUBLICATIONS

"4-Channel, 4 MSPS, 16-Bit/14-Bit/12-Bit, Dual, Simultaneous Sampling SAR ADCs" Analog Devices Data Sheet 2019, 37 pages.
"RM0432 Reference manual, STM32L4+ Series advanced Arm®-based 32-bit MCUs" Rev. 9, ST Microelectronics, Jun. 2021, 2300 pages.
"Sample and hold" https://en.wikipedia.org/w/index.php?title=Sample_and_hold&oldid=1145142623, last edited on May 5, 2023, at 11:08 (UTC).
"Successive-approximation ADC" https://en.wikipedia.org/w/index.php?title=Successive-approximation_ADC&oldid=1136435193, last edited on Jan. 30, 2023, at 08:16 (UTC).
"The Research on SAR ADC Integrated Circuit" Huailiang Li and Jing Hu, J. Phys.: Conf. Ser. 1314 (2019), 8 pages.
DE Office Action dated Jun. 18, 2024 issued in DE 10 2023 209 653.6.

* cited by examiner

*Primary Examiner* — Peguy Jean Pierre
(74) *Attorney, Agent, or Firm* — SCULLY, SCOTT, MURPHY & PRESSER, P.C.

(57) ABSTRACT

An analog to digital converter configured to acquire a first sample comprising a first plurality of bits representative of a digital signal, determine one or more bit positions within the first plurality of bits that are variable, determine one or more bit positions within the first plurality of bits that are static, and acquire a second sample after having acquired the first sample, the second sample comprising a second plurality of bits representative of the digital signal, at least a portion of the one or more bit positions that are variable have their bit values generated by sampling the analog signal, and each of the one or more bit positions that are static have their bit values set to the same bit value as the bit value of the corresponding bit position in the first sample.

20 Claims, 7 Drawing Sheets

ANALOG TO DIGITAL CONVERTER FOR CONVERTING ANALOG SIGNAL TO DIGITAL SIGNAL

The present disclosure relates to an analog to digital converter. In particular, the present disclosure relates to an analog to digital converter for converting an analog signal to a digital signal by sampling the analog signal to generate the digital signal.

BACKGROUND

Figure 1:
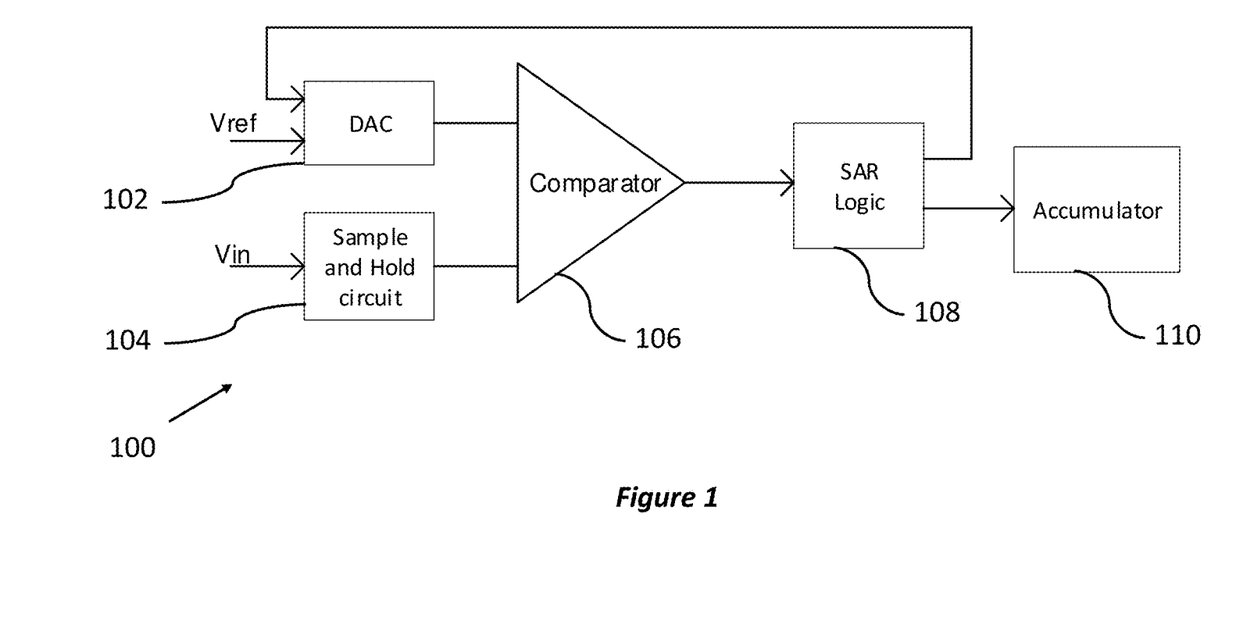
FIG. 1 is a schematic of an analog to digital converter (ADC) 100.

FIG. 1 is a schematic of an analog to digital converter (ADC) 100. The ADC 100 is a successive approximation register (SAR) ADC that uses oversampling (OVS).

OVS is a process in which an input signal is repeatedly digitized to obtain data at a higher sampling frequency than the Nyquist rate. OVS can be used to increase the signal to noise ratio (SNR) and to increase the effective resolution of the sampling data.

The effective resolution is described by the effective number of bits (ENOB). For example, a system may have 8 bit resolution, but due to noise, only 6 bits are unaffected by the noise, thereby providing an ENOB of 6 bits. It is assumed that noise is the main factor affecting ENOB.

The SAR ADC 100 comprises a digital to analog converter (DAC) 102, a sample and hold circuit 104, a comparator 106, a SAR logic circuit 108, and an accumulator 110.

The SAR ADC 100 receives an input voltage Vin, that is an analog signal to be converted. The SAR ADC 100 also receives a reference voltage Vref.

In operation, the sample and hold circuit 104 receives the input voltage Vin. The input voltage Vin is sampled and held at a fixed value for a time period. At a subsequent time period, the input voltage Vin is then sampled and held again, with the process being repeated, such that an output signal provided by the circuit 104 comprises a series of constant voltage values over successive time periods, that are representative of the input voltage Vin.

In operation, the comparator 106 compares the input voltage Vin, as processed by the circuit 104 to the output of the DAC 102. The SAR logic circuit 108 provides a digital code that is representative of the input voltage Vin to the DAC 102. The DAC 102, using the reference voltage Vref, converts the digital code to an analog value that is provided to the comparator 106.

The most popular SAR ADC structure uses Sample and Hold, and DAC blocks combined into one capacitive DAC block. This DAC uses charge redistribution principle while the sampling and converting logic of ADC remains the same as in the circuit in FIG. 1.

The successive approximation process is such that the digital code that is representative of the input voltage Vin has its bits generated successively. For example, the most significant bit (MSB) is initially generated, with subsequent processing being used to determine further bits with incrementally less significance, such that with each bit determined, the signal becomes more accurate in the generation of the digital signal that is representative of the analog signal (the input voltage Vin).

The operation of the SAR ADC will be well known to the skilled person. The accumulator 110 stores each sample from the process and then calculates the result.

Known ADCs that use oversampling are described in:
1. STMicroelectronics, "STM32L4+ Series advanced Arm®-based 32-bit MCUs", RM0432 Reference manual Rev 9, June 2021, 670-671. https://www.st.com/resource/en/reference_manual/rm0432-stm3214-series-advanced-armbased-32bit-mcus-stmicroelectronics.pdf (accessed Jan. 10, 2023)
2. Analog Devices, Inc., "4-Channel, 4 MSPS, 16-Bit/14-Bit/12-Bit, Dual, Simultaneous Sampling SAR ADCs", AD7386/AD7387/AD7388 datasheet rev. A, 2019, 37p. https://www.analog.com/media/en/technical-documentation/data-sheets/ad7386-7387-7388.pdf (accessed Jan. 10, 2023)

The drawback of these devices is the increased time of getting the oversampling result when compared with a typical sampling process, and the resultant increased power consumption when using an oversampling unit.

SUMMARY

It is desirable to provide an ADC that improves upon known ADC designs.

Specifically, it is desirable to provide an ADC (such as an ADC using oversampling) that is faster and has reduced power consumption when compared with known systems.

According to a first aspect of the disclosure there is provided an analog to digital converter for converting an analog signal to a digital signal by sampling the analog signal to generate the digital signal, the analog to digital converter being configured to acquire a first sample comprising a first plurality of bits that is representative of the digital signal, determine one or more bit positions within the first plurality of bits that are variable, determine one or more bit positions within the first plurality of bits that are static, and acquire a second sample after having acquired the first sample, the second sample comprising a second plurality of bits that is representative of the digital signal, wherein for the acquisition of the second sample at least a portion of the one or more bit positions that are variable have their bit values generated by sampling of the analog signal, and each of the one or more bit positions that are static have their bit values set to the same bit value as the bit value of the corresponding bit position in the first sample.

Optionally, sampling the analog signal to generate the digital signal comprises oversampling.

Optionally, the analog to digital converter is configured to determine which of the one or more bit positions within the first plurality of bits that are variable require measurement, and for the acquisition of the second sample each of the one or more bit positions that require measurement have their bit values generated by sampling of the analog signal.

Optionally, the analog to digital convert is configured to receive a number of noise bits, and determine the one or more bit positions within the first plurality of bits that are variable using the first sample and the number of noise bits.

Optionally, the noise bits are representative of the peak-to-peak noise of the digitized input signal.

Optionally, the analog to digital converter is configured to determine the one or more bit positions within the first plurality of bits that are variable using the first sample and the number of noise bits by determining a noise range for the first sample, and assessing which of the bit positions of the first sample are variable across the noise range.

Optionally, the analog to digital converter is configured to determine the noise range for the first sample by determining an upper noise estimate of the first sample by adding the peak-to-peak noise to the first sample, and determining a lower noise estimate of the first sample by subtracting the peak-to-peak noise from the first sample.

Optionally, the analog to digital converter is configured to determine which of the one or more bit positions within the first plurality of bits that are variable require measurement, and for the acquisition of the second sample each of the one or more bit positions that require measurement have their bit values generated by sampling of the analog signal.

Optionally, the number of bit positions that require measurement is equal to the number of noise bits plus two.

Optionally, the bit positions that are variable comprise the noise bits, a double noise bit, carry bits and a full noise bit, and the bit positions that require measurement are the noise bits, the double noise bit and the full noise bit.

Optionally, the bit positions of the noise bits are the least significant bits.

Optionally, the double noise bit has a bit position that is one bit position left of the noise bits.

Optionally, the carry bits are the bits to the left of the double noise bit having the same bit values as the double noise bits and to the right of the next bit having a different value, the next bit having a different value being the full noise bit.

Optionally, the analog to digital converter is configured to for the acquisition of the second sample each of the noise bits, the double noise bit, and the full noise bit have their bit values generated by sampling of the analog signal, and the carry bits have their values set to the inverted value of the full noise bit.

Optionally, the analog to digital converter is a successive approximation register analog to digital converter.

Optionally, the analog to digital converter comprises a sample and hold circuit configured to receive an input voltage, a digital to analog converter configured to receive a reference voltage, a comparator configured to receive a first signal from digital to analog converter and a second signal from the sample and hold circuit, and a SAR logic circuit configured to receive a comparator output signal from the comparator and to provide a SAR output signal to the digital to analog converter.

Optionally, the analog to digital converter comprises an accumulator configured to store the first sample and to calculate a result of the oversampling procedure using the first sample.

Optionally, the analog to digital converter comprises a controller configured to receive the first sample, determine the one or more bit positions within the first plurality of bits that are variable, determine one or more bit positions within the first plurality of bits that are static, and control the SAR logic circuit such that for the acquisition of the second sample, at least a portion of the one or more bit positions that are variable have their bit values generated by sampling of the analog signal, and each of the one or more bit positions that are static have their bit values set to the same bit value as the bit value of the corresponding bit position in the first sample.

Optionally, the controller is configured to determine which of the one or more bit positions within the first plurality of bits that are variable require measurement, and control the SAR logic circuit such that for the acquisition of the second sample each of the one or more bit positions that require measurement have their bit values generated by sampling of the analog signal.

Optionally, the controller is configured to receive a number of the noise bits, and determine the one or more bit positions within the first plurality of bits that are variable using the first sample and the number of noise bits.

Optionally, the noise bits are representative of the peak-to-peak noise of the digitized input signal.

Optionally, the controller is configured to determine the one or more bit positions within the first plurality of bits that are variable using the first sample and the number of noise bits by determining a noise range for the first sample, and assessing which of the bit positions of the first sample are variable across the noise range.

Optionally, the controller is configured to determine a noise range for the first sample by determining an upper noise estimate of the first sample by adding the peak-to-peak noise to the first sample, and determining a lower noise estimate of the first sample by subtracting the peak-to-peak noise from the first sample.

Optionally, the analog to digital converter comprises an accumulator configured to store the first sample and the second sample and to calculate a result of the oversampling procedure using the first and second samples.

Optionally, the analog to digital converter is configured to acquire a third sample after having acquired the second sample, the third sample comprising a third plurality of bits that is representative of the digital signal.

Optionally, the analog to digital converter is configured to acquire a fourth sample after having acquired the third sample, the fourth sample comprising a fourth plurality of bits that is representative of the digital signal.

Optionally, the third and/or fourth sample are acquired using one or more of the features described in relation to the second sample of the first aspect.

According to a second aspect of the disclosure there is provided a method of converting an analog signal to a digital signal using an analog to digital converter by sampling the analog signal to generate the digital signal, the method comprising acquiring a first sample comprising a first plurality of bits that is representative of the digital signal, determining one or more bit positions within the first plurality of bits that are variable, determining one or more bit positions within the first plurality of bits that are static, and acquiring a second sample after having acquired the first sample, the second sample comprising a second plurality of bits that is representative of the digital signal, wherein for the acquisition of the second sample at least a portion of the one or more bit positions that are variable have their bit values generated by sampling of the analog signal, and each of the one or more bit positions that are static have their bit values set to the same bit value as the bit value of the corresponding bit position in the first sample.

It will be appreciated that the method of the second aspect may include providing and/or using features set out in the first aspect and can incorporate other features as described herein.

BRIEF DESCRIPTION OF THE DRAWINGS

The disclosure is described in further detail below by way of example and with reference to the accompanying drawings in which:

FIG. 6(*a*) is a graph showing an output for a 2-bit ADC, FIG. 6(*b*) is a graph showing an output for a 3-bit ADC, and FIG. 6(*c*) is a graph showing four conversions of the signal with noise.

DETAILED DESCRIPTION

Figure 2A:
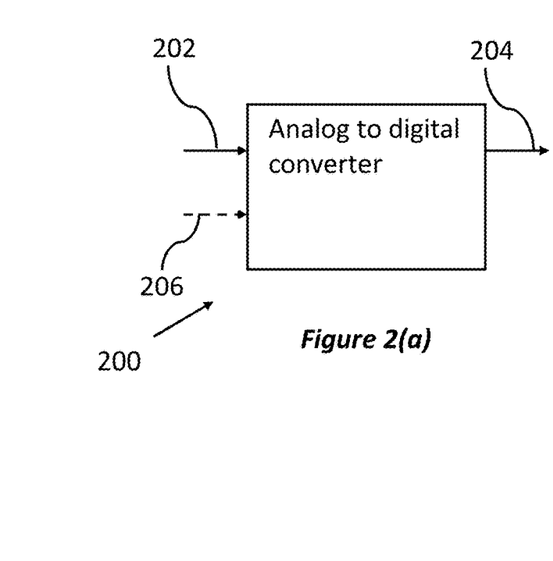
FIG. 2(a) is a schematic of an ADC in accordance with a first embodiment of the present disclosure.

FIG. 2(*a*) is a schematic of an ADC 200 for converting an analog signal 202 to a digital signal 204 using a sampling process, and in accordance with a first embodiment of the present disclosure.

Figure 2B:
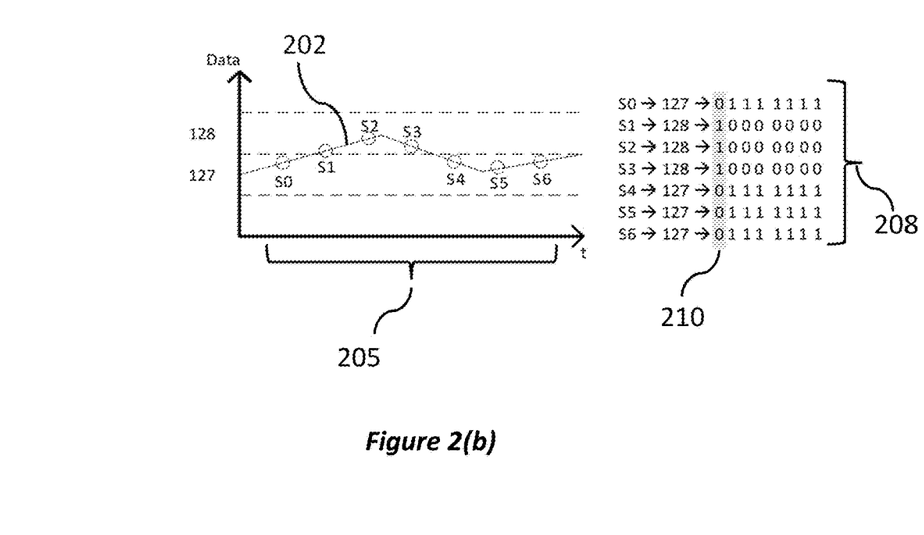
FIG. 2(b) is a graph showing the analog signal and the samples 208 that form the digital signal.

FIG. 2(*b*) is a graph showing the analog signal 202 varying over an oversampling period 205 and the samples 208 that form the digital signal 204, with one bit noise.

In operation, the ADC 200 acquires a first sample comprising a first plurality of bits that is representative of the digital signal 204

The ADC 200 then determines which bit positions within the first plurality of bits are variable and which positions are static before acquiring a second sample. The second sample comprises a second plurality of bits that is representative of the digital signal 204.

The ADC 200 may determine which bit positions within the first plurality of bits are variable and which positions are static, within a sampling period, before acquiring a second sample. The sampling period may be an oversampling period when sampling the analog signal 202 to generate the digital signal 204 comprises oversampling.

For the acquisition of the second sample, at least a portion of the one or more bit positions that are variable have their bit values generated by sampling of the analog signal 202.

It will be appreciated that the description provided focus on the acquisition of the second sample. However, further embodiments of the present disclosure may include acquiring at least one subsequent sample using the same methods as described in relation to the second sample. All samples may be acquired in a single sampling period, for example and oversampling period. Preferably, an oversampling period includes the acquisition of four or more samples.

During operation, the ADC 200 determines bit positions within the first plurality of bits that are static, in that they will not change, or are unlikely to change, between samples. For the acquisition of the second sample, each of the bit positions that are static have their bit values set to the same bit value as the bit value of the corresponding bit position in the first sample.

In a specific embodiment, all variable bit values may be generated by sampling. For example, the first sample may comprise the following 8 bits 10010101. During operation the ADC 200 would determine which bit positions of the 8 bits will be variable. For example, in the present case the 2 least significant bits may assessed as being variable. The remaining bits may be assessed as being static.

Therefore, in the acquisition of the second sample, only the 2 least significant bits will be sampled. The remaining bits may be equal to the corresponding bits of the first sample. The resultant second sample may be 10010111.

In an alternative embodiment, only a subset of variable bit values may be generated by sampling, with the other variable bit values being determined by another means.

For example, it may be possible to deduce the bit value of a variable bit based on the value of another bit within another bit position. This is possible due to binary-weighted structure of the successive approximation register of the ADC. In this case measurement or determination of the other bit may be sufficient to know the value of the variable bit, thereby rendering the measurement of the variable bit unnecessary.

For example, it may be possible to deduce the bit value of a plurality of variable bits based on the value of a plurality of other bits within other bit positions. This is possible due to binary-weighted structure of the successive approximation register of the ADC. In this case measurement or determination of the other bits may be sufficient to know the value of the variable bits, thereby rendering the measurement of the variable bits unnecessary.

This is shown in the FIG. 2(*b*) 208, 210. The variable bit 210 must be measured while all other bits can be deduced based on the value of bit 210.

For example, the first sample may comprise the following 8 bits 10010101. During operation the ADC 200 would determine which bit positions of the 8 bits will be variable. For example, in the present case the 2 least significant bits may assessed as being variable. The remaining bits may be assessed as being static.

The variable bits are the two right most bits "01". It may be known through analysis, or by another means, that the leftmost variable bit always has an inverted value of the rightmost variable bit. Therefore, only measurement of a single one of these two bits is required to know the value of the other.

Therefore, in the acquisition of the second sample, only the least significant bits may be sampled. The static bits may be equal to the corresponding bits of the first sample and the leftmost variable bit may be inverted value of the rightmost variable bit. The resultant second sample may be 10010110.

In a specific embodiment, the ADC 200 may be configured to determine which of the variable bits require measurement. In operation, the second sample may then be acquired using sampling for the bits that require measurement only, with the other variable bits being determined by another means.

It will be appreciated that in further embodiments the procedures described herein may be applied for the acquisition of a subsequent sample, or subsequent samples, after the second sample, with only the variable bits being determined for the acquisition of each new sample.

As it is not necessary to sample the analog signal 202 to generate all bits of the second sample there will be a reduction in sampling time and also power consumption requirements of the ADC 200, when compared with the ADC 100.

The sampling process may comprise oversampling, and can provide "fast OVS". The proposed fast OVS method and apparatus allows a decrease in data acquisition time and power consumed by an ADC that operates in oversampling mode.

In a specific embodiment, the ADC 200 may receive a number of noise bits 206. The number of noise bits 206 is a number that denotes the number of bits that will be susceptible to noise. The number of noise bits 206 may be a user-defined value. The noise bits may be representative of the maximum noise of the ADC 200. For example, the noise bits may represent the expected worst case full system peak-to-peak noise, for example, of the digitized input signal. The user may analyse the system to determine the anticipated maximum noise level, and then use this information to set the number of noise bits 206.

The noise may arise, not only from ADC 200, but from other sources (PCB, external components, etc.). Also the input signal itself can contain a noise.

The ADC 200 may be configured to determine the one or more bit positions within the first plurality of bits that are variable by using the first sample and the number of noise bits 206.

The conditions for traditional OVS, as described in relation to FIG. 1, as well as for the fast OVS method, relating to the ADCs of the present disclosure are:
1) The result of the conversion in the generation of the digital signal 204 contains noise
2) The analog signal 202 is treated as a constant over the oversampling period The oversampling period refers to a time period over which the oversampling process is undertaken. For example, both first and second samples as described previously may be acquired in a single oversampling period.

Preferably, for the ADC 200, the noise amplitude does not exceed the selected noise parameter (number of noise bits) during one oversampling period.

To increase the resolution by one bit with help of OVS, the OVS ratio $K_{OVS}$ must be at least four (four samples):

$$K_{OVS} = 4^N \quad (1)$$

where N is the desired number of additional bits of resolution.

For example, if the resolution of the ADC 200 is 10 bit and the desired result resolution is 12 bit, then OVS ratio should be $K_{OVS}=16$ samples (using equation (1)). The analog signal 202 should be sampled 16 times to get the 12-bit result.

FIG. 2(b) is a graph showing the analog signal 202 varying over an oversampling period 205 and the samples 208 that form the digital signal 204, with one bit noise. The idea of the fast OVS method of the present disclosure is as follows. The difference between samples when operating in OVS mode is several ADC counts during one oversampling period.

It is not necessary to measure all the bit of the result of each sample. It is enough to measure only variable bits that form the result. However, the variable bit can be any bit of the result, not only the least significant bit as shown by the samples 208. In the present example, an 8-bit ADC samples the signal that is being changed by one count between counts 127 and 128.

In FIG. 2(b) all the bits of the result data word are changed, but only one bit (see the column of numbers highlighted by reference numeral 210) can be measured to get the result. The fast OVS method of the present disclosure provides a method to determine the static bits and the variable bits, with some of them preferably sampled, to get the result.

Figure 3A:
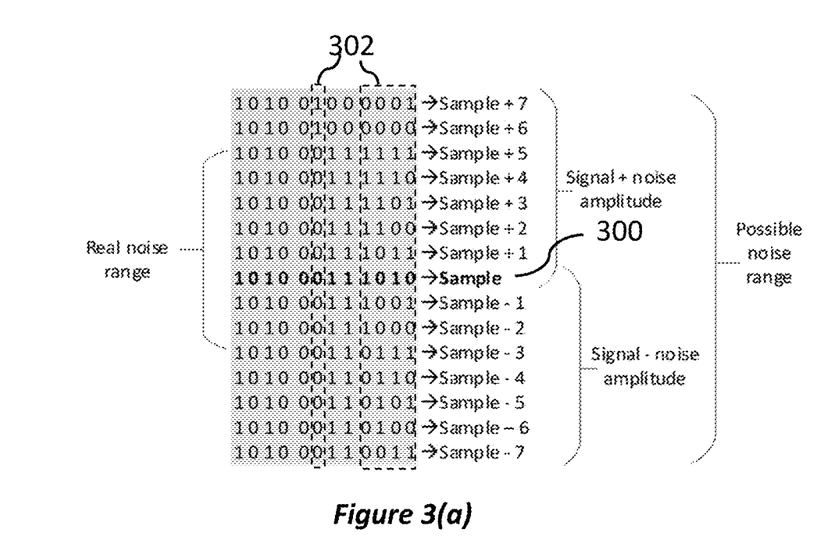
FIG. 3(a) is a table showing a first sample and an estimate of possible subsequent samples based on an estimate of the noise.
Figure 3B:
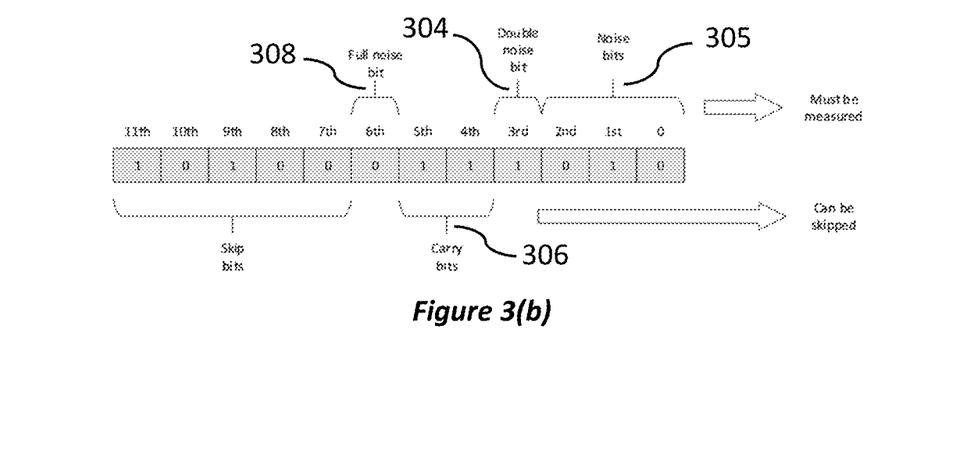
FIG. 3(b) shows the first sample of FIG. 3(a)

FIG. 3(a) is a table showing a first sample 300 and an estimate of possible subsequent samples based on an estimate of the noise. FIG. 3(b) shows the first sample 300 of FIG. 3(a). The present example relates to a SAR ADC using oversampling.

Returning to the ADC 200, in a specific embodiment, the variable bit positions may be determined by determining a noise range for the first sample, and then assessing which of the bit positions are variable across the noise range.

The noise range may be determined by calculating upper and lower noise estimates, with the upper estimate being determined by adding the peak-to-peak noise to the first sample, and the lower estimate being determined by subtracting the peak-to-peak noise from the first sample. As discussed previously, the maximum noise for the system may be represented by the noise bits.

In the present example, the peak-to-peak noise of the acquisition system is 8 counts that may be represented by 3 bits. Therefore, in the present case there would be 3 noise bits (meaning that the number of noise bits 206 is 3). Acquisition system may be a complete device: for example a PCB with a soldered external components, filters, ADC, etc.

In operation, the ADC 200 may perform one full sample/conversion procedure. For example, assuming that the ADC 200 is a 12-bit ADC, there may be provided the result 1010 0011 1010, which is the first sample 300 as shown in FIG. 3(a) and FIG. 3(b).

As the subsequent samples may be within a range from the (first sample+maximum noise) to (first sample−maximum nose), it may be assumed that the possible noise range is equal to the peak-to-peak noise multiplied by two. The possible range of ADC results that can be obtained during the OVS period, including noise, is shown in FIG. 3(a).

In the present example shown in FIG. 3(a) the seven bits starting from the right hand side are susceptible to change across the possible noise range. However only five bits require measurement (as labelled by numeral 302). In the present example the number of bits to be sampled is equal to the number of noise bits plus two.

The description provided herein described bit positions in terms of "right" and "left" based on the conventional method of writing a binary number comprising a plurality of bits, where the leftmost bit is the most significant bit and the rightmost bit is the least significant bit.

The bit positions that are variable comprise the noise bits 305, a double noise bit 304, carry bits 306 and a full noise bit 308. The bit positions that require measurement are the noise bits 305, the double noise bit 304 and the full noise bit 308. It will be appreciated that in further embodiments the categories of bit positions as described may comprise one or more bits and is not limited to the form as described previously. For example, previously carry bits 306 have been described, however in a further embodiment there may only be a single carry bit.

The bit positions of the noise bits 305 may be the least significant bits. In the present example, the noise bits 305 are the three rightmost bit positions.

The double noise bit 304 has a bit position that is one bit position left of the noise bits 305.

The carry bits 306 are the bits to the left of the double noise bit 304 having the same bit values as the double noise bit 304 and to the right of the next bit having a different value, which is the full noise bit 308.

For the acquisition of the second sample each of the noise bits 305, the double noise bit 304, and the full noise bit 308 have their bit values generated by sampling of the analog signal 204. The carry bits 306 have their values set to the inverted value of the full noise bit 308.

In summary, and in the present embodiment, the classification of the bits that form the binary number may be described as follows:

Noise bits—Correspond to peak-to-peak noise of the acquisition system in the general case and ADC noise in the particular case. This may be a user-defined value and the expected worst case full system noise.

Double noise bit—After obtaining the first sample, the possible noise range should be multiplied by 2, since the first result obtained may contain both the lower and upper noise levels (see FIG. 3(a)).

Full noise bit—This bit has the same meaning as the Double noise bit. This bit should be measured due to the SAR structure of the ADC.

Carry bits—These bits have an inverted value to the Full noise bit. These bits may be measured only one time in the first sample/conversion procedure.

Skip bits—These are the static bits as previously described and are unchanged bits during one oversampling period. These bits are measured only one time in the first sample/conversion procedure.

In summary, and in the present embodiment, the variable bits may be divided by the following two types:

Bits that depend on the input signal during one OVS period. These bits are preferably measured. These are Noise bits, Double noise bit, Full noise bit.

Bits that can be automatically defined (deduced) based on the previously measured bits. These bits should preferably not be measured. These are Carry bits (the inverted value of the Full noise bit).

Eventually, there are static and variable bits. But preferably not all the variable bits should be measured. Some of them (Carry bits) can be automatically defined based on the previously measured Full noise bit.

The variable bits may comprise bits that depend on the input signal and bits that can be defined, based in the previously sampled bits.

An example relating to the variable bits is as follows.

For example, ADC samples data, but it's known that the result can be only 151 (b) 1001 0111 or 152 (b) 1001 1000. No other data is possible. The values 151 and 152 differ by 1, but due to the binary numbers' nature, four digits (four bit positions) are changed in a binary representation. Eventually, if it's known that the result can be either 151 or 152, then it's enough to sample only a third bit of the result. In the current example, the bit numbering starts from bit zero, counting from right to left. If the sampled bit is 1, then all other bits to the right of the sampled bit are zeros. Otherwise, if the sampled bit is 0, then all other bits to the right of the sampled bit are ones.

In the case of integrated circuit, the noise bits may be stored in memory registers. The user may program the number of noise bits or the number of bit positions to the memory registers before the device operation. And then ADC will use the value stored in a memory to analyse the samples during oversampling period.

Figure 4:
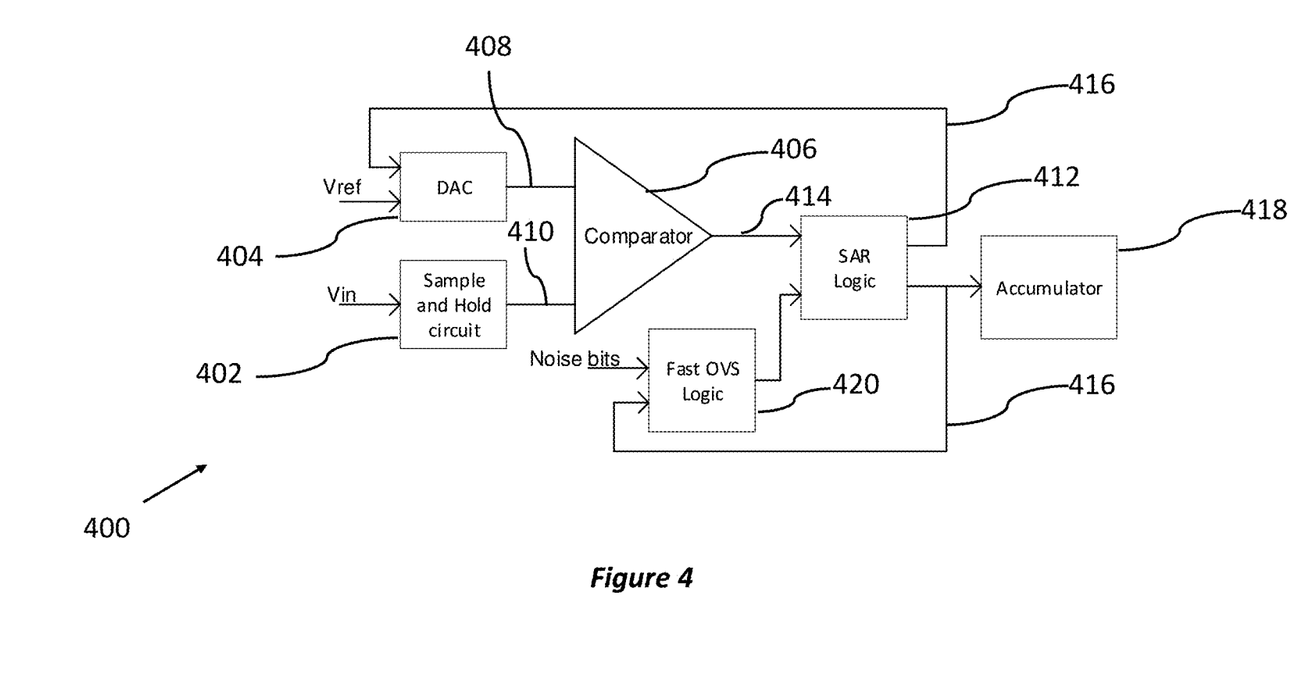
FIG. 4 is a schematic of an ADC in accordance with a second embodiment of the present disclosure.

FIG. 4 is a schematic of an ADC 400 in accordance with a second embodiment of the present disclosure. The ADC 200 is an example of a specific embodiment of the ADC 200. The ADC 400 is a successive approximation register (SAR) ADC.

The ADC 400 comprises a sample and hold circuit 402 configured to receive an input voltage Vin. The ADC 400 comprises a DAC 404 configured to receive a reference voltage Vref. The ADC 400 comprises a comparator 406 configured to receive a first signal 408 from the DAC 404 and a second signal 410 from the sample and hold circuit 402. The ADC 400 further comprises a SAR logic circuit 412 configured to receive a comparator output signal 414 from the comparator 404 and to provide a SAR output signal 416 to the DAC 404.

The output signal 416 may also be provided to the accumulator and the Fast OVS logic circuit 412.

The ADC 400 may comprise an accumulator 418 to store the first sample. The accumulator 418 may be further configured to store the second sample. The accumulator 418 may be configured to store all samples of a single oversampling period. The accumulator 418 may be configured to calculate a result of the oversampling period using the stored samples.

An example describing how the accumulator 418 functions is as follows. The four samples are acquired during one fast OVS period. The data that was acquired: 1st sample is 151, 2nd is 151, 3rd is 152, 4th is 151. At the beginning of the OVS period (before 1st sample), the accumulator (acc) is equal to 0. After 1st sample completed, acc=151. After 2nd sample completed, acc=151+151=302. After 3rd sample, acc=302+152=454. After last 4th sample acc=454+151=605. Then, after the 4th sample, accumulator also needs to calculate the result of the oversampling, result=acc/2=302.5 or 303 (rounded).

The ADC 400 may comprise a controller 420 configured to receive the first sample, determine the variable and static positions and control the SAR logic circuit 412 to acquire the second sample as described previously.

The controller 420 may be a small state machine that performs a simple program (similar to microcontroller core). Such state machines may be designed using an HDL language.

The controller 420 may be further configured to determine the bit positions requiring measurement and to control the SAR logic circuit 412 to generate the bit values requiring measurement, as described previously.

The operation of the ADC 400 may be understood with reference to the previous description provided, and in particular in relation to the ADC 100 and ADC 200, as will be clear to the skilled person.

The controller 420 may be described as a Fast OVS logic block that is implemented in a traditional SAR ADC structure, such as the ADC 100 presented in FIG. 1.

In operation, the Fast OVS logic block analyzes the first full sample of the ADC data and then controls the SAR Logic block 412 to measure the bits of each incoming data word. However, unlike a traditional SAR ADC only several bits that affect the result during one oversampling period are measured. The inputs of the Fast OVS logic block 420 are the number of noise bits set by the user and the SAR Logic block output which provides the first sample of the ADC data.

The method assumes that only a few bits of the output data word change during one oversampling period. Other bits can be skipped or can be recovered using measured bits. In contrast, the traditional oversampling procedure needs to make samples with all the bits measured by ADC.

Figure 5:
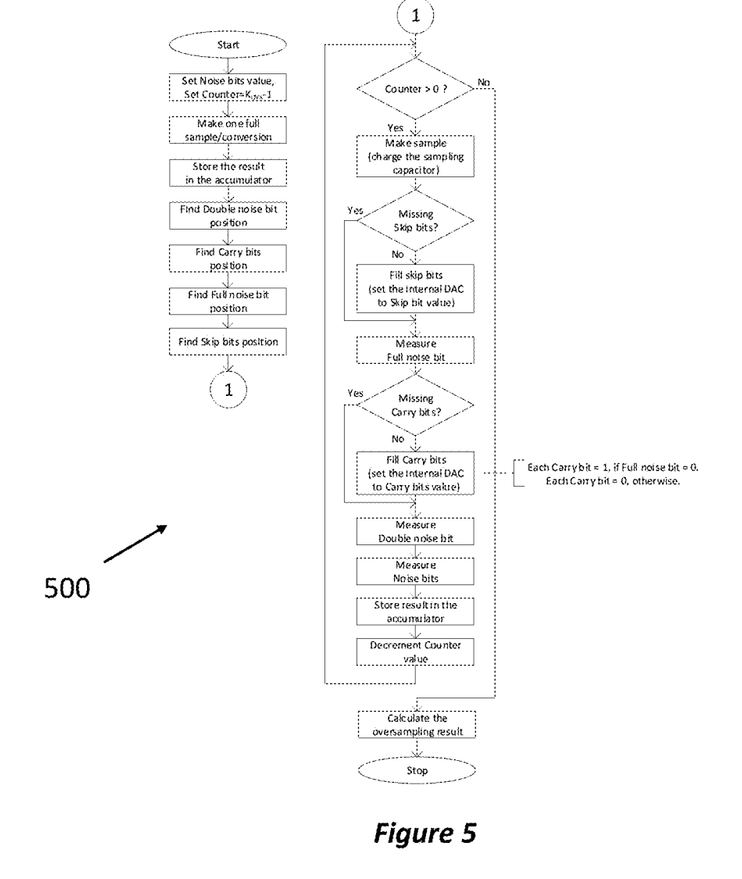
FIG. 5 is a flow chart describing the operation of the ADC of FIG. 4.

FIG. 5 is a flow chart 500 describing the operation of the ADC 400 of FIG. 4, and may be described as follows:

1. Set the 'Noise_bits' value. The allowable range is 1, 2, . . . , [ADC resolution-3].
2. Perform one sample/conversion procedure to get ADC result. Store the result in the accumulator. Then analyze the ADC result and define the bits position:

Find a Double noise bit. This bit is the next bit from the left after Noise bits.

Find Carry bits. These bits are the next bits from the left after the Double noise bit which have the same value as the Double noise bit. It may also be the case that there are no Carry bits and the Double noise bit follows the Full noise bit.

Find Full noise bit. This bit is the first bit from the left after Carry bits which isn't equal to the Double noise bit.

Find Skip bits. These bits are all the next bits to the left after the Full noise bit. These bits will not be changed during oversampling procedure. It may also be the case that there are no Skip bits.
3. All next sample/conversion iterations are performed M times in the loop. Where M=$K_{OVS}$−1
   Make a sample (charge sampling capacitor).
   Set the internal DAC of SAR ADC to the Skip bits value.
   Measure the Full noise bit.
   Set the internal DAC to Carry bits value using the condition:
     If the Full noise bit is 0, then each of the Carry bits=1.
     Otherwise each of the Carry bits=0.
   Measure all other bits (the Double noise bit and Noise bits) using the traditional SAR principle.
   Store result in the accumulator (add the current sample to the accumulator data)
4. Calculate the result of the OVS procedure:

$$\text{Result} = Acc \cdot \frac{2^N}{K_{OVS}}, \quad (2)$$

where Acc is the data of the accumulator, $K_{OVS}$ is the oversampling ratio, and N is the desired number of extra bits of resolution.

The efficiency of the fast OVS method can be evaluated using the equation:

$$\text{Efficiency} = \frac{\text{OVS\_Time}}{\text{Fast\_OVS\_Time}}, \quad (3)$$

where OVS_Time is the time needed to perform single conventional OVS procedure, and Fast_OVS_Time is the time needed to perform single Fast OVS procedure.

For the 12-bit ADC with sampling time $t_{sample}$=1 clock, $t_{conversion}$=12 clocks, peak-to-peak noise of 3 bits (8 counts), and oversampling ratio $K_{OVS}$=16

$$\text{Efficiency} = \frac{(1+12) \cdot 16}{(1+12)+(1+5)*15} \approx 2 \quad (4)$$

For the current example, the Fast OVS method allows to acquire data two times faster and to consume two times less energy than competitor devices.

The following is provided as a brief description of conventional oversampling.

In the case of the 2-bit ADC, the possible four output options are:
(b)00=0 or (1/4)Vref,
(b)01=1 or (2/4)Vref,
(b)10=2 or (3/4)Vref,
(b)11=3 or (4/4)Vref.

The shift of 1 between digital code and Vref values is due to binary numbers format. Counting starts from zero.

It's desired to increase the ADC resolution by 1 bit to get 3-bit result with help of oversampling.

Figure 6A:
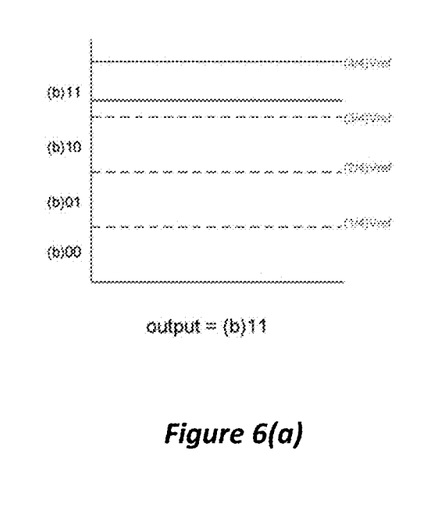
Figure 6B:
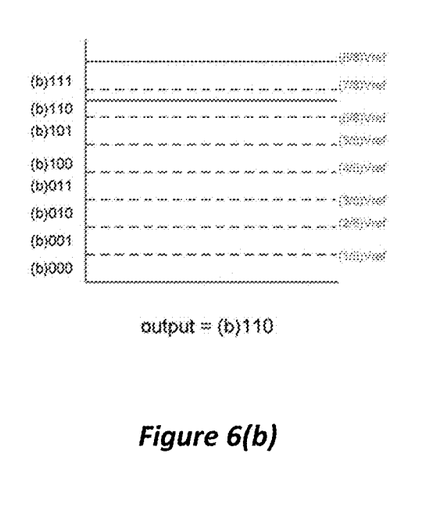

FIG. 6(*a*) is a graph showing an output for a 2-bit ADC. FIG. 6(*b*) is a graph showing an output for a 3-bit ADC. The signal applied to the inputs of 2-bit ADC and 3-bit ADC is the same signal.

Figure 6C:
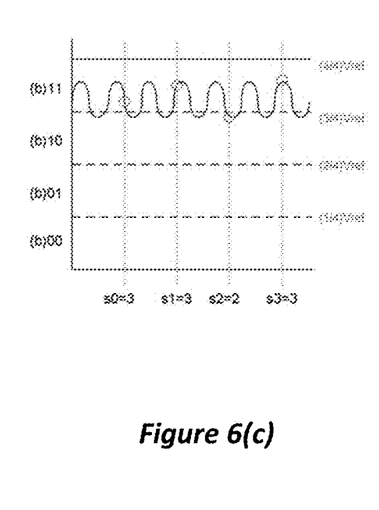

FIG. 6(*c*) is a graph showing four conversions of the signal with noise that is injected to the input of the 2-bit ADC.

The 2-bit ADC output results are: 0th sample=3, 1st sample=3, 2nd sample=2, 3rd sample=3 (decimal numbers). Or 0s sample=(4/4)Vref, 1st sample=(4/4)Vref, 2nd sample=(3/4)Vref, 3rd sample=(4/4)Vref. To calculate the oversampling result the sum of the four ADC samples must be divided by four. OVS Result=(3+3+2+3)/2=5.5≈6 (rounding, since the ADC operates with integers) or (7/8)Vref.

Figure 7:
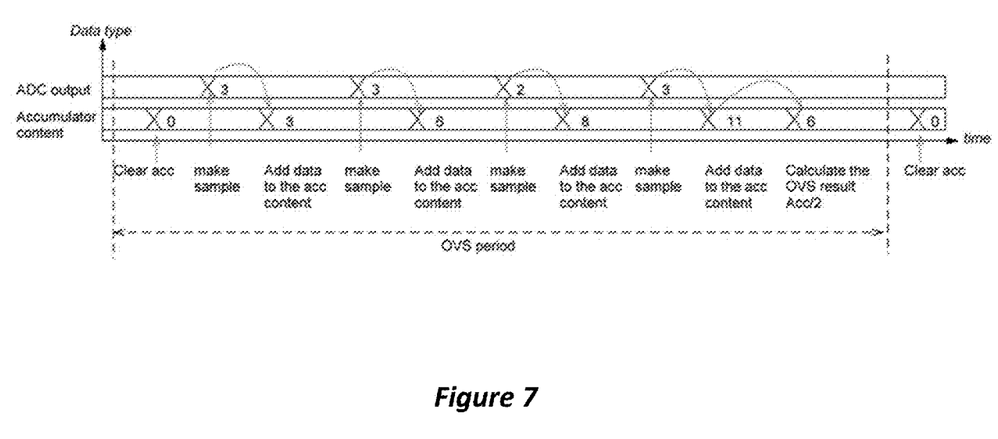
FIG. 7 is a graph showing example results of an accumulator with a 2-bit ADC using oversampling.

A description of how an accumulator functions is as follows. FIG. 7 is a graph showing example results of an accumulator with a 2-bit ADC using oversampling.

The conventional accumulator is a long register that holds the sum of the input data. In embodiments of the present disclosure, the accumulator includes a function of calculating the result of the oversampling.

The accumulator functions irrespective of whether the input data is received using regular OVS or Fast OVS. The task of the accumulator is to sum the data samples and then calculate the OVS result at the end of the OVS period. From the accumulator point of view, the difference between the regular OVS method and Fast OVS is that the second and all other samples of one OVS period will go to the input of the accumulator faster when operating in Fast OVS mode.

Various improvements and modifications may be made to the above without departing from the scope of the disclosure.

The invention claimed is:

1. An analog to digital converter for converting an analog signal to a digital signal by sampling the analog signal to generate the digital signal, the analog to digital converter being configured to:
   acquire a first sample of the analog signal, wherein the first sample comprises a first plurality of bits that is representative of the digital signal;
   determine one or more bit positions within the first plurality of bits in the first sample that are variable;
   determine one or more bit positions within the first plurality of bits in the first sample that are static; and
   acquire a second sample of the analog signal after having acquired the first sample, the second sample comprising a second plurality of bits that is representative of the digital signal; wherein:
   for the acquisition of the second sample:
     for a portion of the one or more bit positions among the first plurality of bits in the first sample that are determined to be variable, have their bit values generated by resampling of the analog signal; and
     for each of the one or more bit positions among the first plurality of bits in the first sample that are determined to be static, have their bit values set to reuse the same bit value as the bit value of the corresponding bit position in the first sample without resampling.

2. The analog to digital converter of claim 1, wherein sampling the analog signal to generate the digital signal comprises oversampling.

3. The analog to digital converter of claim 2 being a successive approximation register analog to digital converter.

4. The analog to digital converter of claim 3 comprising:
   a sample and hold circuit configured to receive an input voltage;
   a digital to analog converter configured to receive a reference voltage;
   a comparator configured to receive a first signal from digital to analog converter and a second signal from the sample and hold circuit; and a SAR logic circuit configured to receive a comparator output signal from the comparator and to provide a SAR output signal to the digital to analog converter.

5. The analog to digital converter of claim 4 comprising an accumulator configured to store the first sample and to calculate a result of the oversampling using the first sample.

6. The analog to digital converter of claim 4 comprising a controller configured to:
receive the first sample;
determine the one or more bit positions within the first plurality of bits that are variable;
determine one or more bit positions within the first plurality of bits that are static; and
control the SAR logic circuit such that for the acquisition of the second sample:
at least a portion of the one or more bit positions that are variable have their bit values generated by resampling of the analog signal; and
each of the one or more bit positions that are static have their bit values set to the same bit value as the bit value of the corresponding bit position in the first sample.

7. The analog to digital converter of claim 6, wherein the controller is configured to:
determine which of the one or more bit positions within the first plurality of bits that are variable require measurement; and
control the SAR logic circuit such that for the generation of the second sample each of the one or more bit positions that require measurement have their bit values generated by resampling of the analog signal.

8. The analog to digital converter of claim 6, wherein the controller is configured to:
receive a number of noise bits; and
determine the one or more bit positions within the first plurality of bits that are variable using the first sample and the number of noise bits.

9. The analog to digital converter of claim 1, configured to:
determine which of the one or more bit positions within the first plurality of bits that are variable require measurement; and
for the acquisition of the second sample, each of the one or more bit positions that require measurement have their bit values generated by resampling of the analog signal.

10. The analog to digital converter of claim 1 configured to:
receive a number of noise bits; and
determine the one or more bit positions within the first plurality of bits that are variable using the first sample and the number of noise bits.

11. The analog to digital converter of claim 10, wherein the noise bits are representative of a peak-to-peak noise of an input signal to the analog to digital converter.

12. The analog to digital converter of claim 11, configured to determine the one or more bit positions within the first plurality of bits that are variable using the first sample and the number of noise bits by:
determining a noise range for the first sample; and
assessing which of the bit positions of the first sample are variable across the noise range.

13. The analog to digital converter of claim 12 configured to determine the noise range for the first sample by:
determining an upper noise estimate of the first sample by adding the peak-to-peak noise to the first sample; and
determining a lower noise estimate of the first sample by subtracting the peak-to-peak noise from the first sample.

14. The analog to digital converter of claim 10, configured to:
determine which of the one or more bit positions within the first plurality of bits that are variable require measurement; and
for the acquisition of the second sample each of the one or more bit positions that require measurement have their bit values generated by resampling of the analog signal.

15. The analog to digital converter of claim 14, wherein the bit positions that are variable comprise the noise bits, a double noise bit, carry bits and a full noise bit, and the bit positions that require measurement are the noise bits, the double noise bit and the full noise bit.

16. The analog to digital converter of claim 15, wherein the bit positions of the noise bits are the least significant bits.

17. The analog to digital converter of claim 16, wherein the double noise bit has a bit position that is one bit position left of the noise bits.

18. The analog to digital converter of claim 17, wherein the carry bits are the bits to the left of the double noise bit having the same bit values as the double noise bits and to the right of the next bit having a different value, the next bit having a different value being the full noise bit.

19. The analog to digital converter of claim 18, configured to:
for the acquisition of the second sample each of the noise bits, the double noise bit, and the full noise bit have their bit values generated by resampling of the analog signal; and
the carry bits have their values set to an inverted value of the full noise bit.

20. A method of converting an analog signal to a digital signal using an analog to digital converter by sampling the analog signal to generate the digital signal, the method comprising:
acquiring a first sample of the analog signal, wherein the first sample comprises a first plurality of bits that is representative of the digital signal;
determining one or more bit positions within the first plurality of bits in the first sample that are variable;
determining one or more bit positions within the first plurality of bits in the first sample that are static; and
acquiring a second sample of the analog signal after having acquired the first sample, the second sample comprising a second plurality of bits that is representative of the digital signal; wherein:
for the acquisition of the second sample:
for a portion of the one or more bit positions among the first plurality of bits in the first sample that are determined to be variable have their bit values generated by resampling of the analog signal; and
for each of the one or more bit positions among the first plurality of bits in the first sample that are determined to be static have their bit values set to reuse the same bit value as the bit value of the corresponding bit position in the first sample without resampling.

* * * * *